United States Patent
Coffie

(10) Patent No.: US 10,109,728 B2
(45) Date of Patent: Oct. 23, 2018

(54) TRANSISTOR STRUCTURE INCLUDING A SCANDIUM GALLIUM NITRIDE BACK-BARRIER LAYER

(71) Applicant: Robert L. Coffie, Plano, TX (US)

(72) Inventor: Robert L. Coffie, Plano, TX (US)

( * ) Notice: Subject to any disclaimer, the term of this patent is extended or adjusted under 35 U.S.C. 154(b) by 0 days.

(21) Appl. No.: 15/806,568

(22) Filed: Nov. 8, 2017

(65) Prior Publication Data

US 2018/0138303 A1    May 17, 2018

Related U.S. Application Data

(60) Provisional application No. 62/420,997, filed on Nov. 11, 2016.

(51) Int. Cl.

| | |
|---|---|
| *H01L 29/20* | (2006.01) |
| *H01L 29/778* | (2006.01) |
| *H01L 29/267* | (2006.01) |
| *H01L 29/66* | (2006.01) |
| *H01L 29/205* | (2006.01) |
| *H01L 29/24* | (2006.01) |

(52) U.S. Cl.
CPC ...... *H01L 29/7783* (2013.01); *H01L 29/2003* (2013.01); *H01L 29/205* (2013.01); *H01L 29/24* (2013.01); *H01L 29/267* (2013.01); *H01L 29/66462* (2013.01); *H01L 29/7787* (2013.01)

(58) Field of Classification Search
CPC . H01L 27/22; H01L 29/2003; H01L 29/7784; H01L 29/7787; H01L 43/12
See application file for complete search history.

(56) References Cited

U.S. PATENT DOCUMENTS

| | | | |
|---|---|---|---|
| 2004/0094801 A1* | 5/2004 | Liang | B82Y 10/00 257/347 |
| 2016/0340783 A1* | 11/2016 | Lu | C23C 16/483 |
| 2017/0294529 A1* | 10/2017 | Beam, III | H01L 29/7784 |

* cited by examiner

*Primary Examiner* — Jaehwan Oh

(57) ABSTRACT

A transistor structure including a scandium gallium nitride back-barrier layer. For instance, the transistor structure may include a buffer layer disposed on a substrate and a back-barrier layer disposed on the buffer layer, the back-barrier layer including scandium gallium nitride ($Sc_xGa_{1-x}N$). The transistor structure may further include a channel layer disposed on the back-barrier layer, and a barrier layer disposed on the channel layer. The barrier layer may include at least one of aluminum gallium nitride, indium gallium aluminum nitride, scandium aluminum nitride, scandium aluminum gallium nitride, or indium gallium boron aluminum nitride. The transistor structure may be incorporated into a high electron mobility transistor (HEMT).

21 Claims, 6 Drawing Sheets

TRANSISTOR STRUCTURE INCLUDING A SCANDIUM GALLIUM NITRIDE BACK-BARRIER LAYER

CROSS-REFERENCE TO RELATED APPLICATION(S)

This application claims the benefit of U.S. Provisional Application No. 62/420,997, filed Nov. 11, 2016 and entitled "Transistor Structure Including a Scandium Gallium Nitride Back-barrier Layer," the entirety of which is incorporated by reference herein.

BACKGROUND

Semiconductor field-effect transistors (FETs) are commonly used for in microelectronics circuits and applications. One type of FET is a high electron mobility transistor (HEMT). A HEMT includes a barrier layer and a channel layer. A two-dimensional electron gas (2DEG) or a two-dimensional hole gas (2DHG) often forms at an interface between the barrier layer and the channel layer. Performance of the HEMT may be improved if the 2DEG or 2DHG is confined to the channel layer.

SUMMARY

Various techniques are described herein that utilize a $Sc_xGa_{1-x}N$ back-barrier layer between the channel layer and the buffer layer of a Group III-Nitride-based transistor. The $Sc_xGa_{1-x}N$ back-barrier layer presents an energy barrier to electrons in the channel layer that reduces (e.g., prevents) channel electrons from traveling into the buffer layer and thus confines channel electrons to the channel layer.

DETAILED DESCRIPTION

Embodiments of the present disclosure provide techniques and configurations of a transistor structure including a scandium gallium nitride ($Sc_xGa_{1-x}N$) back-barrier layer. In the following detailed description, reference is made to the accompanying drawing which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of the embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, are used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. In a first example, "coupled" may mean that two or more elements are in direct physical and/or electrical contact. In a second example, "coupled" may mean that two or more elements indirectly contact each other. It will be recognized that any of the two or more elements may still cooperate and/or interact with each other. It will be further recognized that one or more other elements may be coupled or connected between the elements that are said to be coupled with each other.

In various embodiments, the phrase "a first layer formed, disposed, or otherwise configured on a second layer," may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

Figure 1A:
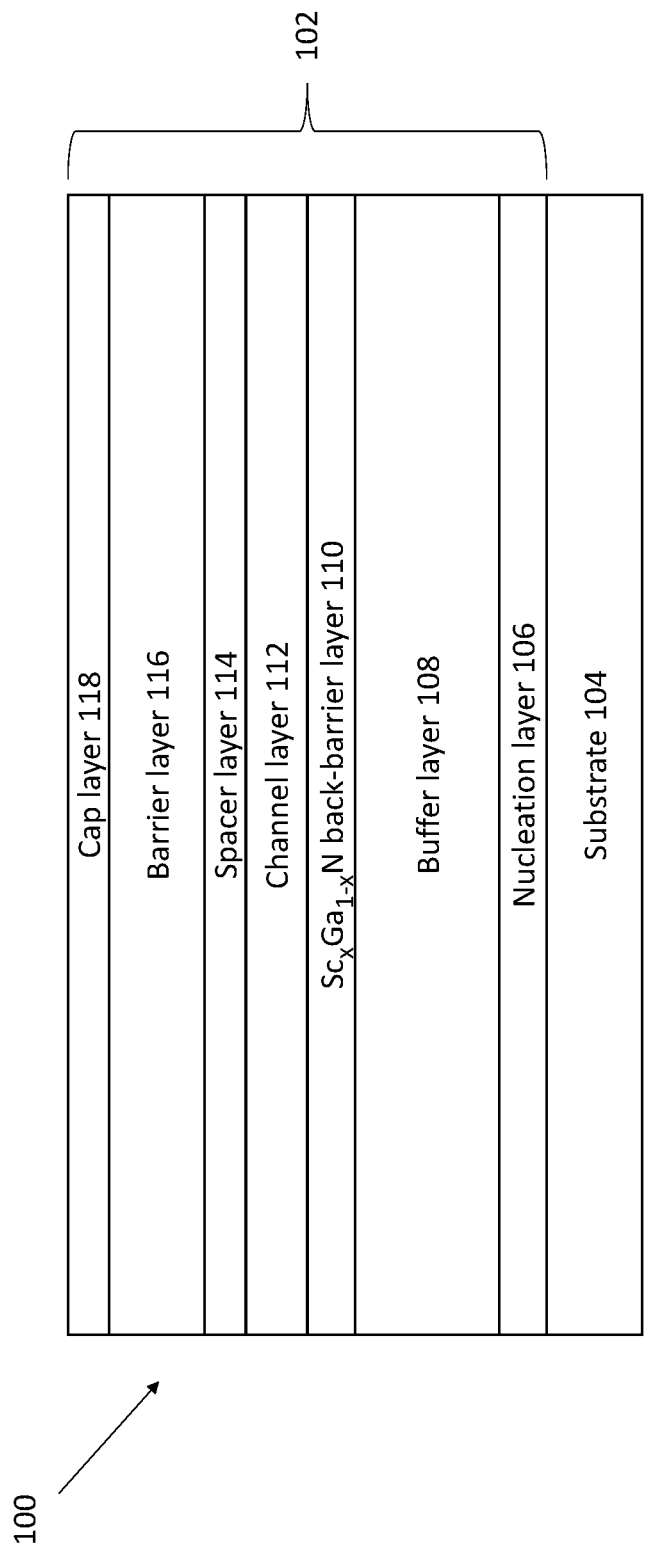
FIG. 1A schematically illustrates a cross-sectional view of a typical Group III-Nitride-based transistor structure.
Figure 1B:
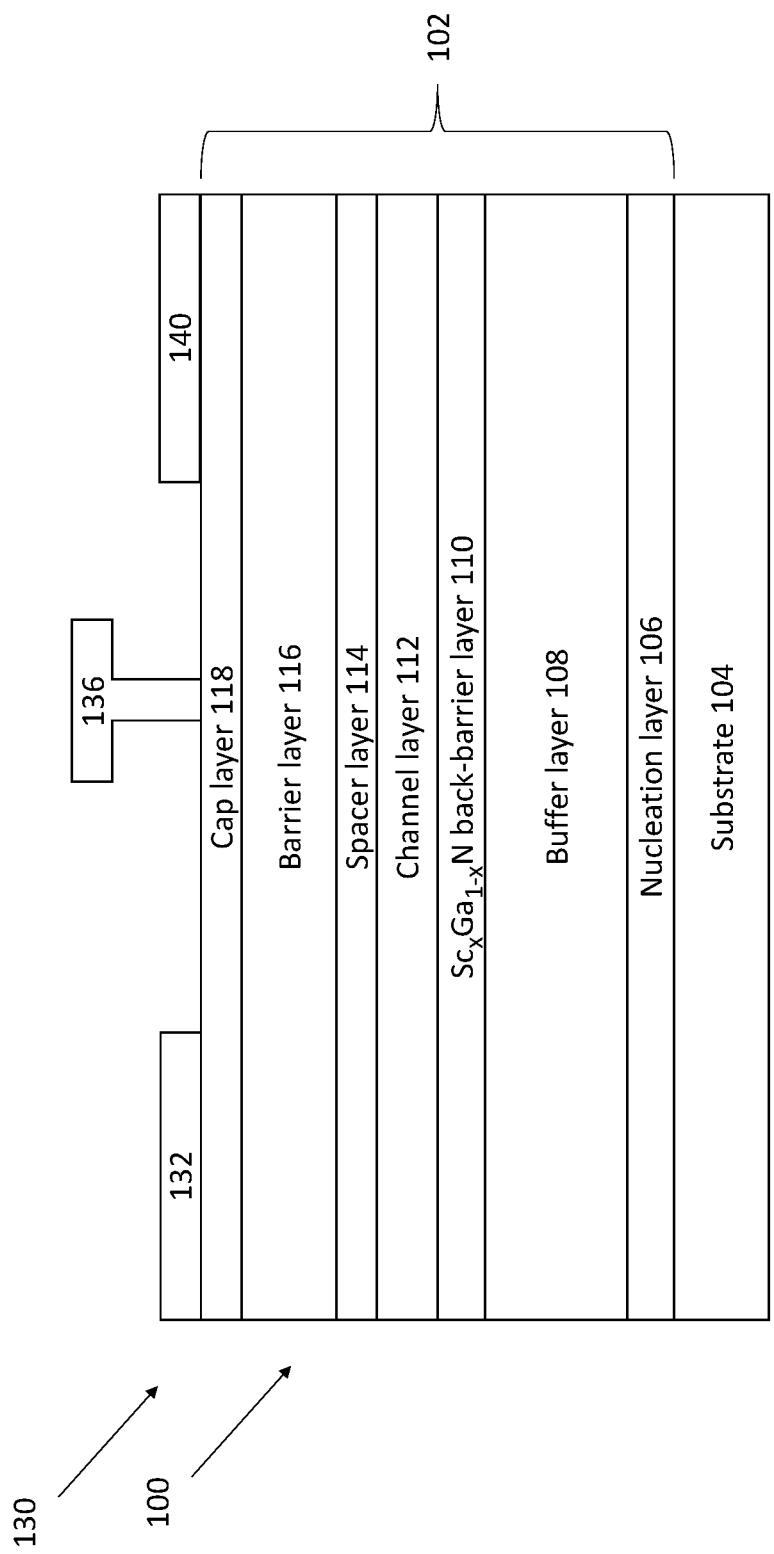
FIG. 1B schematically illustrates a cross-sectional view of a Group III-Nitride-based high electron mobility transistor (HEMT) that incorporates the transistor structure of FIG. 1A.

FIG. 1A schematically illustrates a cross-sectional view of a transistor structure 100, according to various embodiments. The transistor structure 100 may be used to form a transistor, such as a high electron mobility transistor (HEMT), as shown in FIG. 1B and further discussed below. The transistor structure 100 may include a stack of layers (collectively referred to as stack 102) formed on a substrate 104. The stack 102 may include layers of different material systems that form one or more heterojunctions/heterostructures.

The substrate 104 generally includes a support material upon which the stack 102 may be deposited. The substrate may include any suitable material, such as silicon (Si), silicon carbide (SiC), aluminum oxide ($Al_2O_3$) or "sapphire," gallium nitride (GaN), and/or aluminum nitride (AlN). Other materials including suitable group II-VI and group III-V semiconductor material systems may be used for the substrate 104 in other embodiments.

In various embodiments, the transistor structure 100 may include a buffer layer 108 disposed on the substrate 104. In some embodiments, the transistor structure 100 may further include a nucleation layer 106 disposed between the buffer layer 108 and the substrate 104. For example, in some embodiments, the nucleation layer 106 may be in direct contact with the substrate 104 and/or the buffer layer 108 may be in direct contact with the nucleation layer 106. In some embodiments, the nucleation layer 106 may include aluminum nitride (AlN). The nucleation layer 106 may facilitate formation and bonding of the buffer layer.

In various embodiments, the buffer layer 108 may provide a crystal structure transition between the substrate 104 and/or nucleation layer 106 and other components of the transistor structure 100, thereby acting as a buffer or isolation layer between the substrate 104 and other components of the transistor structure 100. For example, the buffer layer 108 may provide stress relaxation between the substrate 104 and other lattice-mismatched materials, as further discussed below.

In various embodiments, the transistor structure 100 includes a $Sc_xGa_{1-x}N$ back-barrier layer 110 disposed on the buffer layer 108. The $Sc_xGa_{1-x}N$ back-barrier layer 110 may reduce (e.g., prevent) channel electrons from traveling into the buffer layer 108 from the channel layer 112. The $Sc_xGa_{1-x}N$ back-barrier layer 110 may reduce (e.g., prevent) current flow through the buffer layer 108. The $Sc_xGa_{1-x}N$ back-barrier layer 110 may increase transistor gain by reducing channel electrons from traveling into the buffer layer 108 from the channel layer 112.

In various embodiments, the transistor structure 100 may further include a channel layer 112 disposed on the $Sc_xGa_{1-x}N$ back-barrier layer 110. For example, the channel layer 112 may be in direct contact with the $Sc_xGa_{1-x}N$ back-barrier layer 110. The channel layer 112 may include, for example, gallium nitride (GaN). The channel layer 112 may serve as a channel for mobile charge carriers of the transistor structure 100.

The transistor structure 100 may further include a barrier layer 116 disposed on the channel layer 112. The barrier layer 116 may include for example, aluminum gallium nitride (AlGaN), indium gallium aluminum nitride (InGaAlN), indium aluminum nitride (InAlN), scandium aluminum nitride (ScAlN), scandium aluminum gallium nitride (ScAlGaN), or indium gallium boron aluminum nitride (InGaBAlN).

In some embodiments, the transistor structure 100 may further include a spacer layer 114 disposed between the barrier layer 116 and the channel layer 112. For example, the spacer layer 114 may be in direct contact with the channel layer 112 and/or the barrier layer 116. The spacer layer 114 may include, for example, AlN. The spacer layer 114 may reduce (e.g., prevent) alloy scattering between the barrier layer 116 and channel layer 112.

In some embodiments, the transistor structure 100 may further include a cap layer 118 disposed on and in direct contact with the barrier layer 116. The cap layer 118 may include, for example, GaN.

The layers of stack 102 are shown in FIG. 1A as an example. In other embodiments, the stack 102 may include more, fewer, or different layers from those shown in FIG. 1A. Additionally, or alternatively, one or more of the layers of the stack 102 shown in FIG. 1A may include (e.g., be composed of) a plurality of layers and/or a plurality of materials.

FIG. 1B illustrates a HEMT 130 that may be formed from the transistor structure 100 accordance with various embodiments. The HEMT 130 may include a drain contact 132, a gate contact 136, and a source contact 140 that may be formed of a conductive material (e.g., metal). The drain contact 132 and source contact 140 may be annealed to form ohmic contacts with the channel layer 112. In some embodiments, the gate contact 136 may be a Schottky barrier contact. In some embodiments, an insulating layer (not shown) may be included between the gate contact 136 and one or more layers of the stack 102 (e.g., the cap 118 and/or barrier layer 116). It will be apparent that other configurations of the drain contact 132, gate contact 136, and/or source contact 140 may be used in other embodiments. For example, in some embodiments, one or more of the drain contact 132, gate contact 136, and/or source contact 240 may be recessed into the cap layer 118 and/or the barrier layer 116.

In various embodiments, the HEMT 130 may selectively conduct current between the source contact 140 and drain contact 132 responsive to a voltage applied at the gate contact 136 (e.g., relative to the source contact 140). The HEMT 130 may be an enhancement mode transistor or a depletion mode transistor.

Figure 2A:
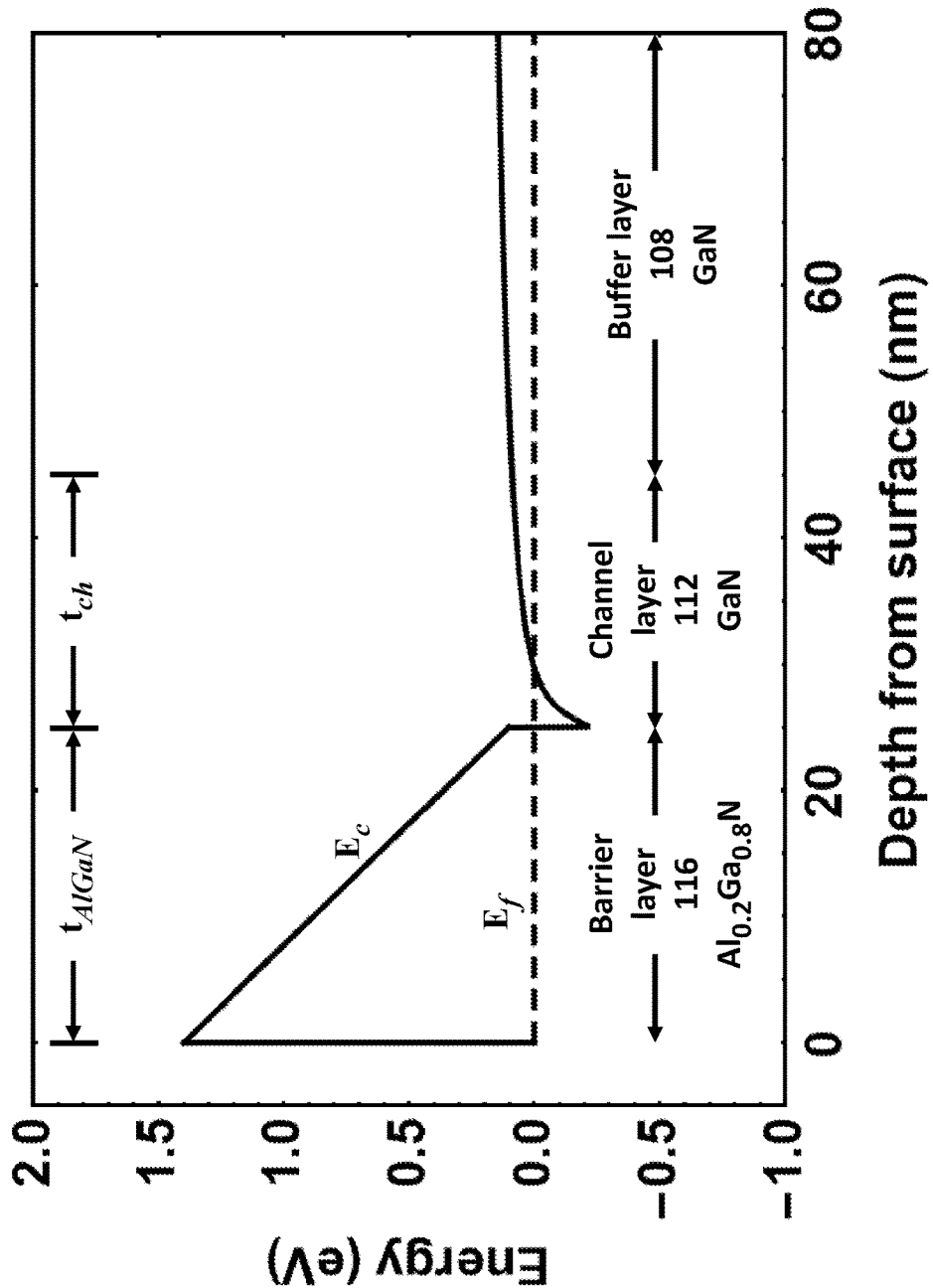
FIG. 2A shows an equilibrium band diagram of a GaN-based transistor without the $Sc_xGa_{1-x}N$ back-barrier layer inserted between the channel layer and buffer layer.

FIG. 2A is an equilibrium band-edge diagram depicting the conduction band edge, $E_c$, of a GaN-based HEMT in which the buffer layer 108 comprises GaN, the $Sc_xGa_{1-x}N$ back-barrier layer 110 is not present, the channel layer 112 comprises GaN and the barrier layer 116 comprises $Al_{0.2}Ga_{0.8}N$. The thickness of the barrier layer 116, $t_{AlGaN}$, is 25 nm. Because the bandgap of AlGaN is larger than GaN, there is a band-edge discontinuity at the interface between the barrier layer 116 and the channel layer 112. The nature of this discontinuity is such that a potential energy well for electrons is formed in the channel layer 112 near the barrier layer 116. Electrons are confined to the channel layer 112 and a two-dimensional electron gas (2DEG) is formed. It should be noted that because AlGaN and GaN are polar materials, they have spontaneous polarization. Additionally, AlGaN and GaN have different lattice parameters resulting in strain at the interface between these materials. This strain results in piezoelectric polarization. The spontaneous and piezoelectric charges result in a positive polarization charge at the interface between the channel layer 112 and the barrier layer 116. These polarization charges intensify the sharp band-edge discontinuity at the interface between the barrier layer 116 and the channel layer 112, further confining electrons to the 2DEG. However, without the $Sc_xGa_{1-x}N$ back-barrier layer 110, the interface between the channel layer 112 and buffer layer 108 is not a heterointerface; thus, there are no differences in bandgap or polarization charges between the channel layer 112 and the buffer layer 108, and the conduction band is continuous. As a result, "hot electrons" may travel into the buffer layer 108 from the channel layer 112 relatively easily. "Hot electrons" are electrons that have sufficient energy to escape the attractive pull of the potential energy well at the interface between the channel layer 112 and the barrier layer 116. "Hot electrons" may be present in high-electric field regions of the channel layer 112. These "hot electrons" may have sufficient energy to move into another region, such as the buffer layer 108, which may ultimately degrade the performance of the HEMT.

Figure 2B:
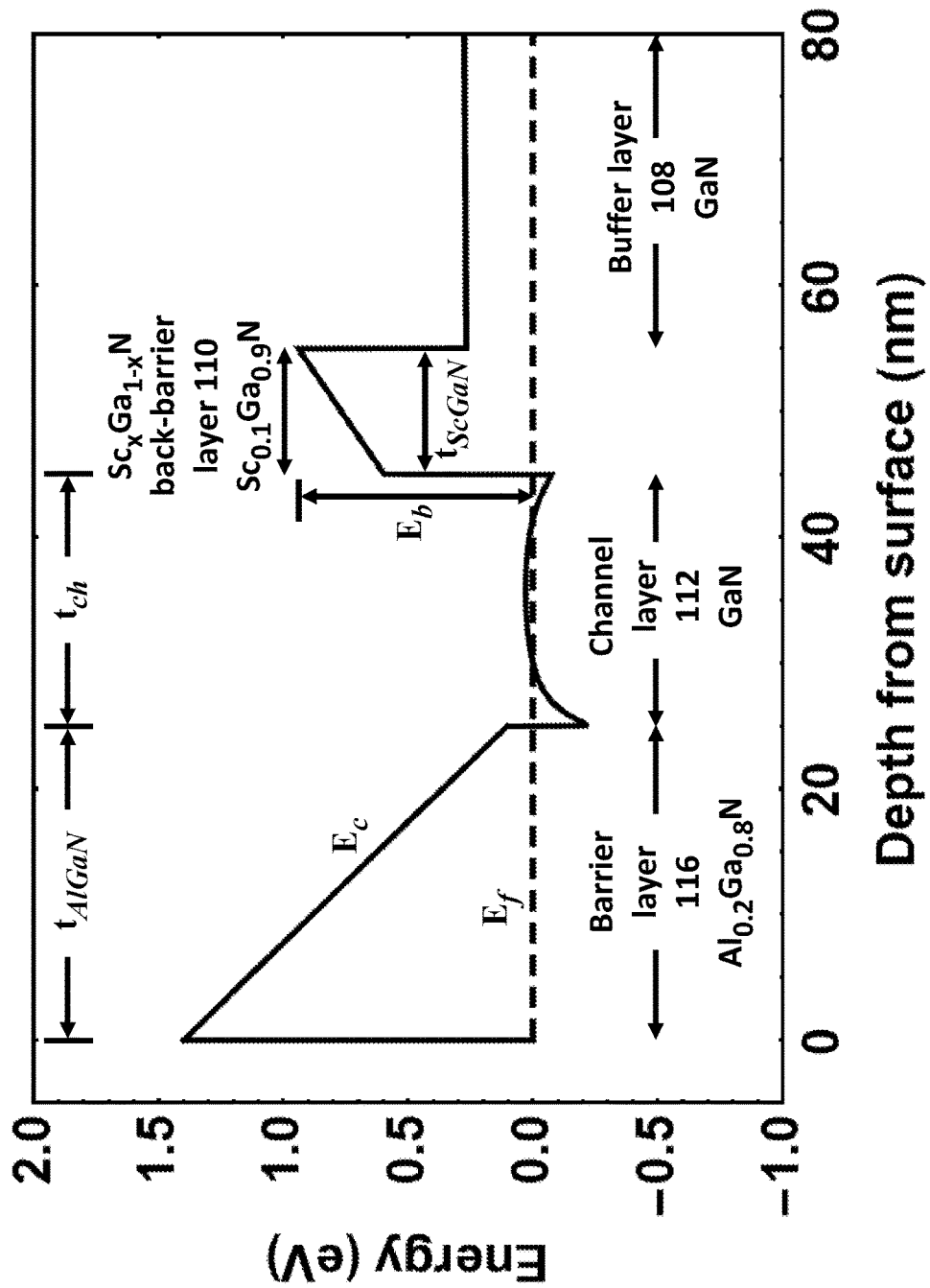
FIG. 2B shows an equilibrium band diagram of a GaN-based transistor with the $Sc_xGa_{1-x}N$ back-barrier layer inserted between the channel layer and buffer layer. The piezoelectric polarization and spontaneous polarization in the $Sc_xGa_{1-x}N$ back-barrier layer is such that the energy barrier to channel electrons is increased.

FIG. 2B is an equilibrium band-edge diagram depicting the conduction band edge of a GaN-based HEMT where the buffer layer 104 comprises GaN, the $Sc_xGa_{1-x}N$ back-barrier layer 110 includes scandium gallium nitride according to $Sc_xGa_{1-x}N$ with x equal to 0.1, the channel layer 112 comprises GaN and the barrier layer 116 comprises $Al_{0.2}Ga_{0.8}N$. The thickness of the $Sc_xGa_{1-x}N$ back-barrier layer 110, $t_{ScGaN}$, is 10 nm, the thickness of the channel layer 112, $t_{ch}$, is 20 nm and the thickness of the barrier layer 116, $t_{AlGaN}$, is 25 nm. As was described for FIG. 2A, the band-edge discontinuity and the polarization charges at the interface between the barrier layer 116 and the channel layer 112 are such that a potential energy well for electrons is formed in the channel layer 112 near the barrier layer 116. Electrons are confined to the channel layer 112 and a two-dimensional electron gas (2DEG) is formed. With the $Sc_xGa_{1-x}N$ back-barrier layer 110 present in the stack 102, a discontinuity in the conduction band exist between the channel layer 112 and buffer layer 108. The energy barrier created by the discontinuity in the conduction band may reduce (e.g., prevent) the "hot electrons" in the channel layer 112 from traveling into the buffer layer 108. Additionally, scandium gallium nitride according to $Sc_xGa_{1-x}N$ with x in a range between 0.01 and 0.40 is a polar material with spontaneous polarization. ScGaN and GaN also have different lattice parameters resulting in strain at the interface between these materials. This strain results in piezoelectric polarization. At the interface between the channel layer 112 and the $Sc_xGa_{1-x}N$ back-barrier layer 110, the spontaneous and piezoelectric charges may be such that a positive polarization charge results. At the interface between the buffer layer 108 and the $Sc_xGa_{1-x}N$ back-barrier layer 110, the spontaneous and piezoelectric charges may be such that a negative polarization charge results. Thus, a polarization-induced electric field may exist in the $Sc_xGa_{1-x}N$ back-barrier layer 110 that may increase the energy barrier, $E_b$, that the "hot electrons" are to overcome in order to travel into the buffer layer 108. Hence, the $Sc_xGa_{1-x}N$ back-barrier layer 110 may reduce channel electrons from traveling into the buffer layer 108. Transistor gain may be reduced when channel electrons travel into the buffer layer 108. Hence, the $Sc_xGa_{1-x}N$ back-barrier layer 110 may increase gain by reducing channel electrons from traveling into the buffer layer 108. When channel electrons travel through the buffer layer 108, the current is called buffer current. Hence, the $Sc_xGa_{1-x}N$ back-barrier layer 110 may reduce buffer current by reducing channel electrons from traveling into the buffer layer 108.

Figure 2C:
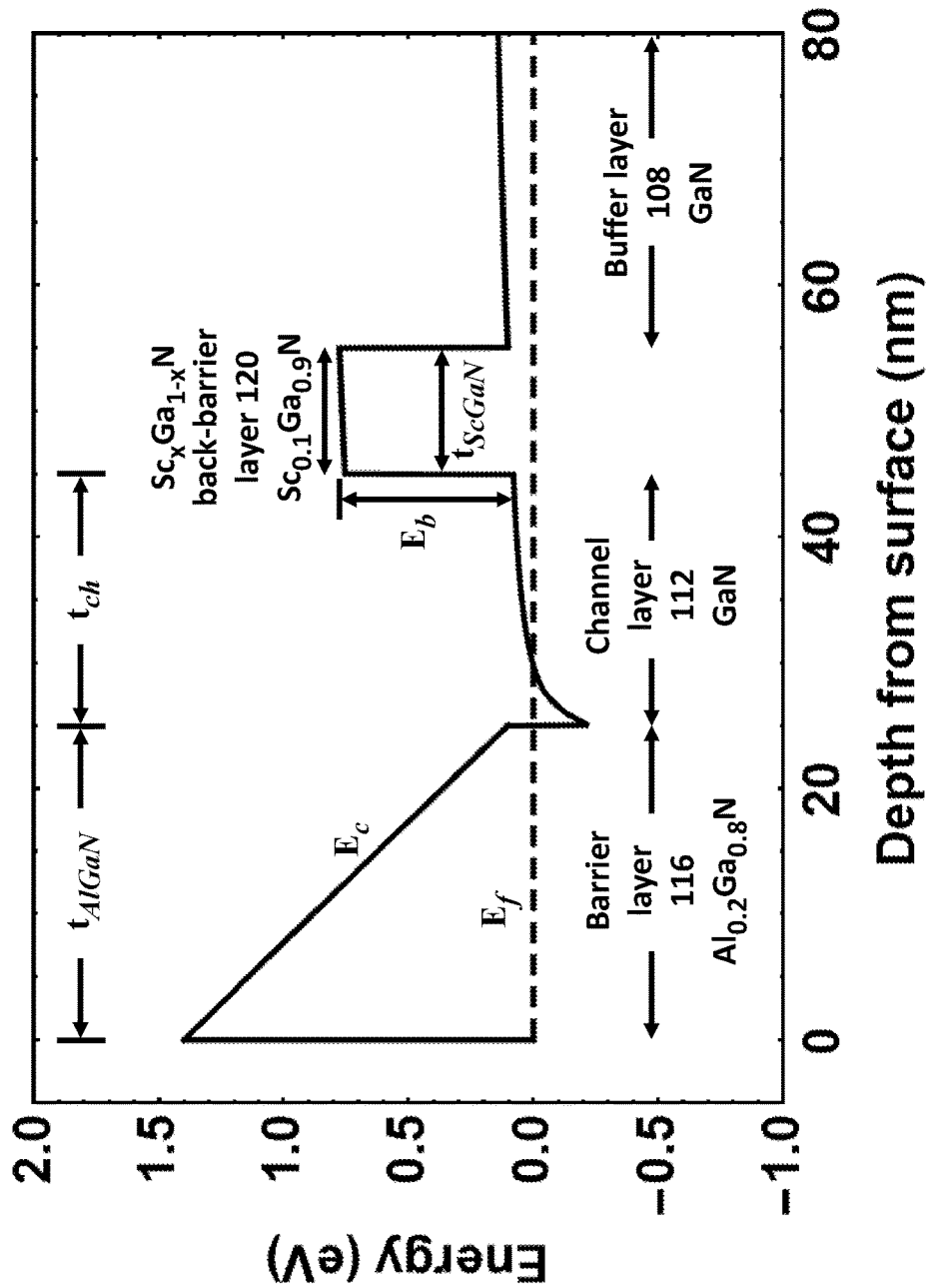
FIG. 2C shows an equilibrium band diagram of a GaN-based transistor with the $Sc_xGa_{1-x}N$ back-barrier layer inserted between the channel layer and buffer layer. The piezoelectric polarization and spontaneous polarization in the $Sc_xGa_{1-x}N$ back-barrier layer is such that the energy barrier to channel electrons is not increased.

FIG. 2C is an equilibrium band-edge diagram of the same structure shown in FIG. 2B except the $Sc_xGa_{1-x}N$ back-barrier layer 110 has been replaces with a $Sc_xGa_{1-x}N$ back-barrier layer 120 where the polarization is approximately zero. The energy barrier, $E_b$, created by the discontinuity in the conduction band may reduce the "hot electrons" in the channel layer 112 from traveling into the buffer layer 108 without polarization in the $Sc_xGa_{1-x}N$ back-barrier layer. Hence, the $Sc_xGa_{1-x}N$ back-barrier layer 120 may reduce channel electrons from traveling into the buffer layer 108. Transistor gain may be reduced when channel electrons travel into the buffer layer 108. Hence, the $Sc_xGa_{1-x}N$ back-barrier layer 120 may increase gain by reducing channel electrons from traveling into the buffer layer 108. When channel electrons travel through the buffer layer 108, the current is called buffer current. Hence, the $Sc_xGa_{1-x}N$ back-barrier layer 120 may reduce buffer current by reducing channel electrons from traveling into the buffer layer 108.

Figure 3:
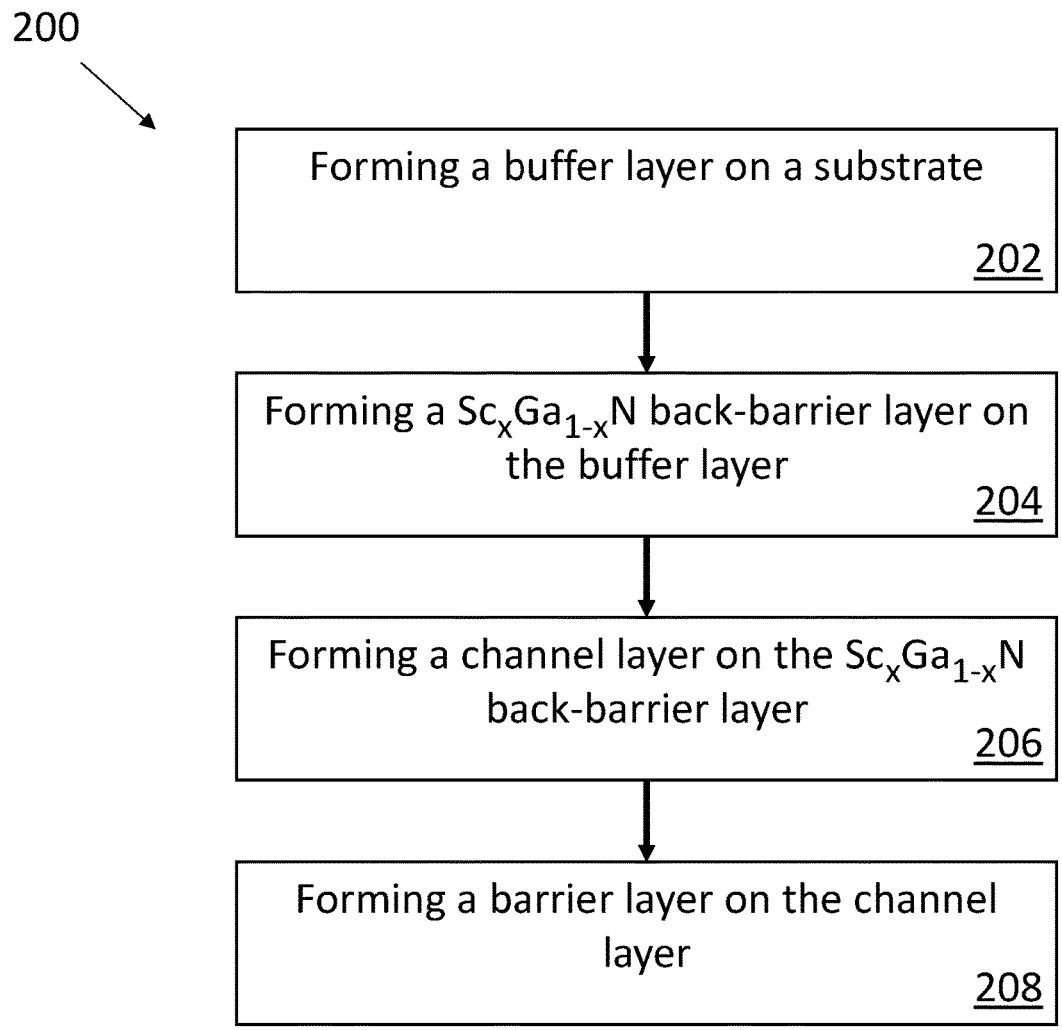
FIG. 3 is a flow diagram of a method for fabricating a transistor, according to various embodiments.

FIG. 3 illustrates a method 200 of forming a HEMT (e.g., HEMT 130) in accordance with various embodiments. The method 200 includes forming a plurality of layers on a substrate (e.g., substrate 104), as further described below. In various embodiments, the layers may be formed by any suitable process, including but not limited to molecular beam epitaxy, metalorganic vapor phase epitaxy, and chemical vapor deposition. In some embodiments, the method 200 may further include one or more etching operations to remove a portion of one or more layers of the HEMT structure.

At 202, the method 200 may include forming a buffer layer (e.g., buffer layer 108) on a substrate. In some embodiments, the method 200 may include forming a nucleation layer (e.g., nucleation layer 106) on the substrate, and forming the buffer layer on the nucleation layer. The nucleation layer may include, for example, AlN. In other embodiments, the buffer layer may be formed directly on the substrate.

At 204, the method 200 may include forming a back-barrier layer (e.g., $Sc_xGa_{1-x}N$ back-barrier layer 110) on the buffer layer.

At 206, the method 200 may include forming a channel layer (e.g., channel layer 112) on the back-barrier layer. The channel layer may include, for example, GaN.

At 208, the method 200 may include forming a barrier layer (e.g., barrier layer 116) on the channel layer. The barrier layer may include, for example, AlGaN, InAlN, InGaAlN, ScAlN, ScAlGaN, or InGaBAlN, as described herein. In some embodiments, the method 200 may include forming a spacer layer (e.g., spacer layer 114) on the channel, and forming the barrier layer on the spacer layer. The spacer layer may include, for example, AlN. In other embodiments, the barrier layer may be formed directly on the channel layer.

In some embodiments, the method 200 may further include forming a cap layer (e.g., cap layer 118) on the barrier layer 116. Additionally, the method 200 may include forming a drain contact (e.g., drain contact 132), a source contact (e.g., source contact 140), and/or a gate contact (e.g., gate contact 136) coupled with the cap layer.

Various operations are described as multiple discrete operations in turn, in a manner that is most helpful in understanding the claimed subject matter. However, the order of description should not be construed as to imply that these operations are necessarily order-dependent. In particular, these operations may not be performed in the order of presentation. Operations described may be performed in a different order than the described embodiment. Various additional operations may be performed and/or described operations may be omitted in additional embodiments.

Some non-limiting examples of various embodiments are presented below.

Example 1 is a transistor comprising: a substrate; a buffer layer disposed on the substrate; a back-barrier layer disposed on the buffer layer, the back-barrier layer including scandium gallium nitride; a channel layer disposed on the back-barrier layer; and a barrier layer disposed on the channel layer, the barrier layer including at least one of aluminum gallium nitride, indium aluminum nitride, indium gallium aluminum nitride, scandium aluminum nitride, scandium aluminum gallium nitride, or indium gallium boron aluminum nitride.

Example 2 is the transistor of Example 1, wherein the back-barrier layer includes scandium gallium nitride according to $Sc_xGa_{1-x}N$ with x in a range between 0.01 and 0.40 and the thickness of the back-barrier layer, $t_{ScGaN}$, may be in a range between 2.5 nm and 50 nm.

Example 3 is the transistor of Example 2, wherein x is about (e.g., approximately) 0.05 and $t_{ScGaN}$ may be in a range between 2.5 nm and 50 nm. For instance, x may be in a range between 0.025 and 0.075.

Example 4 is the transistor of Example 2, wherein x is about 0.10 and $t_{ScGaN}$ may be in a range between 2.5 nm and 50 nm. For instance, x may be in a range between 0.075 and 0.125.

Example 5 is the transistor of Example 2, wherein x is about 0.15 and $t_{ScGaN}$ may be in a range between 2.5 nm and 50 nm. For instance, x may be in a range between 0.125 and 0.175.

Example 6 is the transistor of Example 2, wherein x is about 0.20 and $t_{ScGaN}$ may be in a range between 2.5 nm and 50 nm. For instance, x may be in a range between 0.175 and 0.225.

Example 7 is the transistor of Example 2, wherein x is about 0.25 and $t_{ScGaN}$ may be in a range between 2.5 nm and 50 nm. For instance, x may be in a range between 0.225 and 0.275.

Example 8 is the transistor of Example 2, wherein x is about 0.30 and $t_{ScGaN}$ may be in a range between 2.5 nm and 50 nm. For instance, x may be in a range between 0.275 and 0.325.

Example 9 is the transistor of Example 2, wherein x is about 0.35 and $t_{ScGaN}$ may be in a range between 2.5 nm and 50 nm. For instance, x may be in a range between 0.325 and 0.375.

Example 10 is the transistor of Example 1, wherein the barrier layer includes aluminum gallium nitride according to $Al_yGa_{1-y}N$ with y in a range between 0.10 and 1.0.

Example 11 is the transistor of Example 1, further comprising: a nucleation layer disposed between the substrate and the buffer layer; and a spacer layer disposed between the channel layer and the barrier layer.

Example 12 is the transistor of Example 11, wherein the substrate is silicon carbide, the nucleation layer is aluminum nitride, the channel layer is gallium nitride, and the spacer layer is aluminum nitride.

Example 13 is the transistor of Example 1, further comprising: a cap layer disposed on the barrier layer; a drain contact coupled with the cap layer; a source contact coupled with the cap layer; and a gate contact coupled with the cap layer.

Example 14 is a method comprising: forming a buffer layer on a substrate; forming a back-barrier layer on the buffer layer, the back-barrier layer including scandium gallium nitride; forming a channel layer on the buffer layer, the channel layer including gallium nitride; and forming a barrier layer on the channel layer, the barrier layer including at least one of aluminum gallium nitride, indium aluminum nitride, indium gallium aluminum nitride, scandium aluminum nitride, scandium aluminum gallium nitride, and/or indium gallium boron aluminum nitride.

Example 15 is the method of Example 14, further comprising forming an aluminum nitride spacer layer between the channel layer and the barrier layer.

Example 16 is the method of Example 15, where the barrier layer includes aluminum gallium nitride according to $Al_yGa_{1-y}N$ with y in a range between 0.10 and 1.0.

Example 17 is the method of Example 14, further comprising: forming a nucleation layer between the substrate and the buffer layer; and forming a cap layer on the barrier layer.

Example 18 is the method of example 17, further comprising: forming a drain contact coupled with the cap layer; forming a source contact coupled with the cap layer; and forming a gate contact coupled with the cap layer.

In an example embodiment, a $Sc_xGa_{1-x}N$ back-barrier layer includes scandium gallium nitride according to $Sc_xGa_{1-x}N$ with x in a range between 0.01 and 0.40 and the $Sc_xGa_{1-x}N$ back-barrier layer thickness, $t_{ScGaN}$, may be in a range between 2.5 nm and 50 nm to reduce channel electrons from traveling into the buffer layer of Group III-Nitride-based transistors.

While the foregoing written description of the disclosed technologies enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiments, methods, and examples.

What is claimed is:

1. A transistor comprising:
   a substrate;
   a buffer layer disposed on the substrate;
   a back-barrier layer on the buffer layer, the back-barrier layer including scandium gallium nitride;
   a channel layer disposed on the back-barrier layer; and
   a barrier layer disposed on the channel layer, the barrier layer including at least one of aluminum gallium nitride, indium aluminum nitride, indium gallium aluminum nitride, scandium aluminum nitride, scandium gallium aluminum nitride, or indium gallium boron aluminum nitride.

2. The transistor of claim 1, wherein the back-barrier layer includes scandium gallium nitride according to $Sc_xGa_{1-x}N$; and
   wherein x is in a range between 0.01 and 0.40.

3. The transistor of claim 2, wherein x is about 0.05; and
   wherein a thickness of the back-barrier layer is in a range between 2.5 nm and 50 nm.

4. The transistor of claim 2, wherein x is about 0.1; and
   wherein a thickness of the back-barrier layer is in a range between 2.5 nm and 50 nm.

5. The transistor of claim 2, wherein x is about 0.15; and
   wherein a thickness of the back-barrier layer is in a range between 2.5 nm and 50 nm.

6. The transistor of claim 2, wherein x is about 0.2; and
   wherein a thickness of the back-barrier layer is in a range between 2.5 nm and 50 nm.

7. The transistor of claim 2, wherein x is about 0.25; and
   wherein a thickness of the back-barrier layer is in a range between 2.5 nm and 50 nm.

8. The transistor of claim 2, wherein x is about 0.3; and
   wherein a thickness of the back-barrier layer is in a range between 2.5 nm and 50 nm.

9. The transistor of claim 2, wherein x is about 0.35; and
   wherein the thickness of the back-barrier layer is in a range between 2.5 nm and 50 nm.

10. The transistor of claim 1, wherein the barrier layer includes aluminum gallium nitride according to $Al_yGa_{1-y}N$; and
    wherein y is in a range between 0.10 and 1.0.

11. The transistor of claim 10, wherein y is about 0.23.

12. The transistor of claim 1, further comprising:
    a nucleation layer disposed between the substrate and the buffer layer; and
    a spacer layer disposed between the channel layer and the barrier layer.

13. The transistor of claim 12, wherein the substrate is silicon carbide, the nucleation layer is aluminum nitride, the channel layer is gallium nitride, and the spacer layer is aluminum nitride.

14. The transistor of claim 1, further comprising:
    a cap layer disposed on the barrier layer;
    a drain contact coupled with the cap layer;
    a source contact coupled with the cap layer; and
    a gate contact coupled with the cap layer.

15. A method comprising:
    forming a buffer layer on a substrate;
    forming a back-barrier layer on the buffer layer, the back-barrier layer including scandium gallium nitride;
    forming a channel layer on the back-barrier layer, the channel layer including gallium nitride; and forming a barrier layer on the channel layer, the barrier layer including at least one of aluminum gallium nitride, indium aluminum nitride, indium gallium aluminum nitride, scandium aluminum nitride, scandium aluminum gallium nitride, or indium gallium boron aluminum nitride.

16. The method of claim 15, further comprising:

forming an aluminum nitride spacer layer between the channel layer and the barrier layer.

17. The method of claim 15, wherein the back-barrier layer includes scandium gallium nitride according to $Sc_xGa_{1-x}N$;

wherein x is in a range between 0.01 and 0.40; and wherein a thickness of the back-barrier layer is in a range between 2.5 nm and 50 nm.

18. The method of claim 15, wherein the barrier layer includes aluminum gallium nitride according to $Al_yGa_{1-y}N$; and wherein y is in a range between 0.10 and 1.0.

19. The method of claim 18, wherein the barrier layer includes aluminum gallium nitride according to $Al_yGa_{1-y}N$; and wherein y is about 0.23.

20. The method of claim 15, further comprising:

forming a nucleation layer between the substrate and the buffer layer; and forming a cap layer on the barrier layer.

21. The method of claim 20, further comprising:

forming a drain contact coupled with the cap layer;

forming a source contact coupled with the cap layer; and forming a gate contact coupled with the cap layer.

* * * * *